US007023726B1

United States Patent
Chen et al.

(10) Patent No.: US 7,023,726 B1
(45) Date of Patent: Apr. 4, 2006

(54) HYBRID MAGNETORESISTIVE RANDOM ACCESS MEMORY (MRAM) ARCHITECTURE

(75) Inventors: Kuo-Lung Chen, Taipei (TW); Ming-Jer Kao, Tainan (TW); Ming-Jin Tsai, Hsinchu (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 0 days.

(21) Appl. No.: 11/038,107

(22) Filed: Jan. 21, 2005

(30) Foreign Application Priority Data

Nov. 12, 2004 (TW) ............................... 93134647 A

(51) Int. Cl.
*G11C 11/00* (2006.01)
(52) U.S. Cl. .................................. 365/158; 365/230.03
(58) Field of Classification Search ................ 365/158, 365/49, 230.03, 230.06
See application file for complete search history.

(56) References Cited

U.S. PATENT DOCUMENTS 6,778,445 B1 * 8/2004 Ooishi et al. ........... 365/189.05
6,816,431 B1 * 11/2004 Lu et al. ................. 365/230.07

* cited by examiner

*Primary Examiner*—Son T. Dinh
(74) *Attorney, Agent, or Firm*—Bacon & Thomas, PLLC

(57) ABSTRACT

The present invention relates to a hybrid MRAM architecture, and more particularly to a hybrid MRAM architecture capable of being used with an MCU and an MPU. This hybrid MRAM architecture is adapted to a controlling device for accessing a bit of information, comprising a plurality of first MRAM arrays (1T1MTJ architecture), a plurality of second MRAM arrays (XPC architecture), an address line, an access decoder, a sensing and writing circuit, and at least one I/O bus. The access decoder accesses to the bit of information from either the first or the second MRAM arrays selected in accordance with an address signal from the controlling device. The sensing and writing circuit amplifies the bit of information and transmits it to the controlling device via the at least one I/O bus. Accordingly, the access of the bit of information is completed.

7 Claims, 4 Drawing Sheets

To SA/ISRCS

To ISRCS

HYBRID MAGNETORESISTIVE RANDOM ACCESS MEMORY (MRAM) ARCHITECTURE

BACKGROUND OF THE INVENTION

1. Field of the Invention

The present invention relates to a hybrid MRAM architecture, and more particularly to a hybrid MRAM architecture capable of being used with a micro-controller unit (MCU) and a micro-processing unit (MPU).

2. Description of Related Art

At present, the static random access memory (SRAM), dynamic random access memory (DRAM) and flash memory (FLASH) are widely used in the industry. These different kinds of memories all have their respective disadvantages, such as follows:

A DRAM has to write the same information again within a specific period of time (i.e., the so-called information refresh operation) to maintain the contents of the information stored therein. Although without the requirement of the information refresh operation as in the DRAM, the SRAM has a storage density much lower than that of DRAM. Thus, the SRAMs are not suitable for the case where an application of high storage density is required. In addition, once the power is turned off, the information stored in the SRAM and DRAM will be lost and the information contents cannot be maintained. Nevertheless, in the same situation, the information stored in a flash memory will not be lost. It is, however, necessary for the flash memory to continue monitoring the cumulative number of operations in a block (wear out monitor). As such, not only the limitation of the access speed exists, but also the difficulty in designing the interface between the host and the memory increases dramatically. Therefore, the industry currently lacks a single memory capable of being applied to various different circumstances, as in the random access memory (RAM) and the read only memory (ROM) of the present computers. Therefore, if an appropriate memory is chosen to meet with the different requirements of different application circumstances, the processes for designing and manufacturing a system-on-chip (SOC) can be further simplified. The manufacturing cost of the SOC can be reduced, too.

Recently, a novel memory—MRAM has been developed, providing an alternative for the industry. The MRAM has not only the non-volatile characteristic of the FLASH but also a storage density comparable to that of the DRAM and an access speed close to that of the SRAM. Furthermore, the information written into and read out of the MRAM can be performed numbers of times without any limitation as in the DRAM and SRAM. Hence, the MRAM is expected to integrate all of the currently available memories such as FLASH, DRAM and SRAM so as to simplify the process for manufacturing the computer memory and reduce the manufacturing cost significantly. Consequently, the SOC systems can have only the central processing unit (CPU) and the MRAM memory in the future.

Nevertheless, the MRAM has two different kinds of architectures, namely, the one transistor-one magnetic tunnel junction per cell (1T1MTJ) architecture and the cross-point cell (XPC) architecture, as shown in FIGS. 1A and 1B respectively. As illustrated in FIG. 1A, in the 1T1MTJ architecture, each memory cell is connected to a transistor. Hence, the principle of both writing and reading operations of the 1T1MTJ architecture MRAM is similar to that of the DRAM; namely, the speed of both the writing and reading operations is compatible with that of the DRAM. However, because each of the memory cells is connected to a transistor, the storage density of the 1T1MTJ architecture MRAM cannot be increased, and thus, the storage capacity of the 1T1MTJ architecture MRAM is limited.

On the other hand, as illustrated in FIG. 1B, in the XPC architecture, a number of memory cells share a single transistor as opposed to the connection of each of the memory cells to one transistor. Thus, the speed of both the writing and reading operations of the XPC architecture MRAM is slower, as compared with that of the 1T1MTJ architecture MRAM. Even so, the storage density of the XPC architecture MRAM is higher than that of the 1T1MTJ architecture MRAM. Hence, the storage density of the memory, as a whole, can be significantly increased.

Accordingly, to replace all of the presently available memories with the MRAM, the industry requires an MRAM architecture having both the two different architectures and characteristics thereof integrated. Thus, the resulting single memory of MRAM can be used for various demands for memory applications as in the RAM and ROM.

SUMMARY OF THE INVENTION

A hybrid MRAM architecture according to the present invention is adapted to a controlling device for accessing a specific bit of information, comprising a plurality of first MRAM arrays composed of a plurality of MRAM cells each of which has a 1T1MTJ architecture; a plurality of second MRAM arrays composed of a plurality of MRAM cells each of which has an XPC architecture; an address line for transmitting an address signal from the controlling device; an access decoder for respectively connecting to the first MRAM arrays, the second MRAM arrays and the address line, in which the specific bit of information is accessed from either the first MRAM arrays or the second MRAM arrays selected in accordance with the address signal transmitted by the address line; a sensing and writing circuit connected to the access decoder to amplify the specific bit of information read from the memory array; and at least one I/O bus connected to the sensing and writing circuit to transmit the specific bit of information to the controlling device.

In view of the fact that the 1T1MTJ architecture MRAM cell is featured by its fast access speed while the XPC architecture MRAM cell is featured by its high storage density, a hybrid MRAM architecture according to the present invention is capable of having the two different architectures integrated in accordance with the needs in practice so as to replace all of the currently available memories (SRAM, DRAM and flash memory, etc).

The controlling device of the present invention can be any device having a control function, and is preferably a central processing unit (CPU) or a micro-controller unit (MCU). The first MRAM array of the present invention can be employed in any application where a memory is adapted to the CPU, and is preferably a level 1 cache, a level 2 cache or a level 3 storage memory. The second MRAM array of the present invention can be employed in any application where a memory is adapted to the CPU, and is preferably a level 1 cache, a level 2 cache or a level 3 storage memory. The first MRAM array of the present invention can be employed in any application where a memory is adapted to the MCU, and is preferably a cache, a code type memory or a storage memory. The second MRAM array of the present invention can be employed in any application where a memory is adapted to the MCU, and is preferably a cache, a code type memory or a storage memory.

DETAILED DESCRIPTION OF THE PREFERRED EMBODIMENT

Figure 1A:
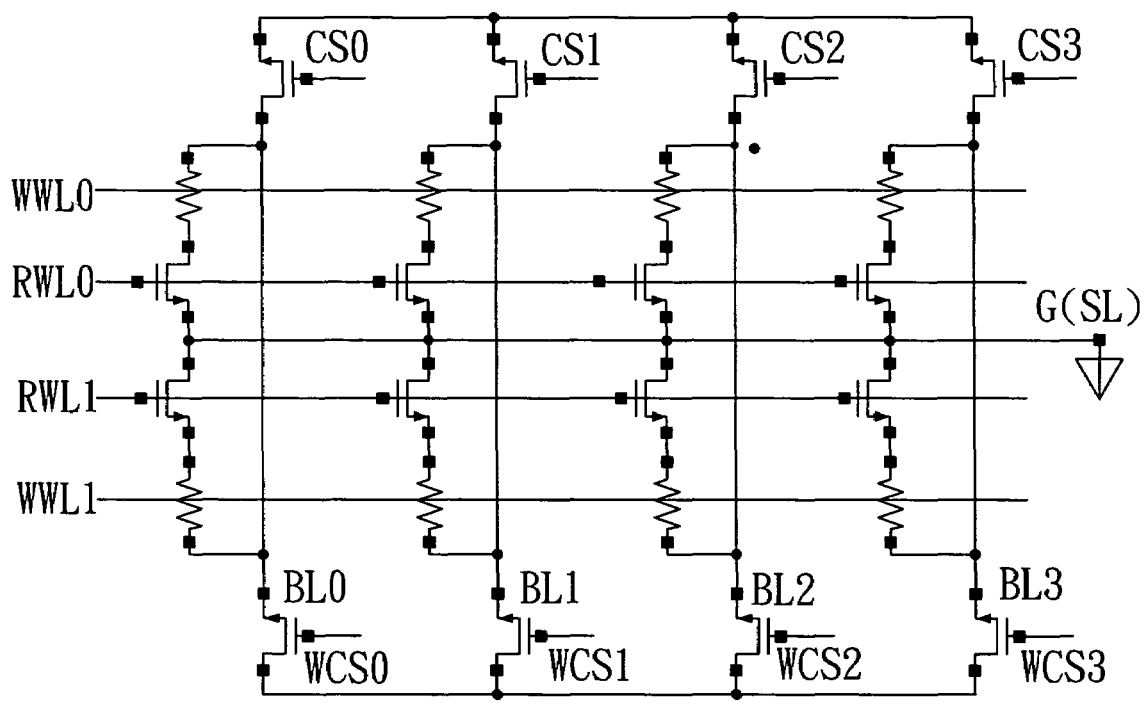
FIG. 1A is a diagram illustrating a conventional MRAM array architecture constituted by 1T1MTJ architecture MRAM cells.
Figure 1B:
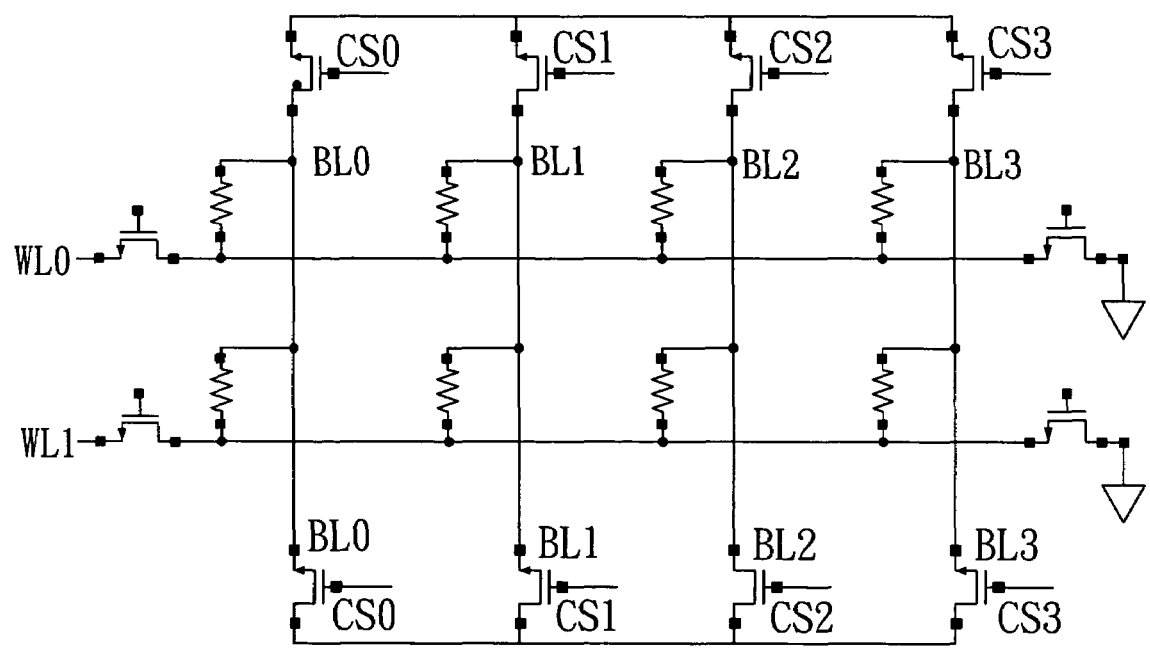
FIG. 1B is diagram illustrating a conventional MRAM array architecture constituted by XPC architecture MRAM cells.
Figure 2:
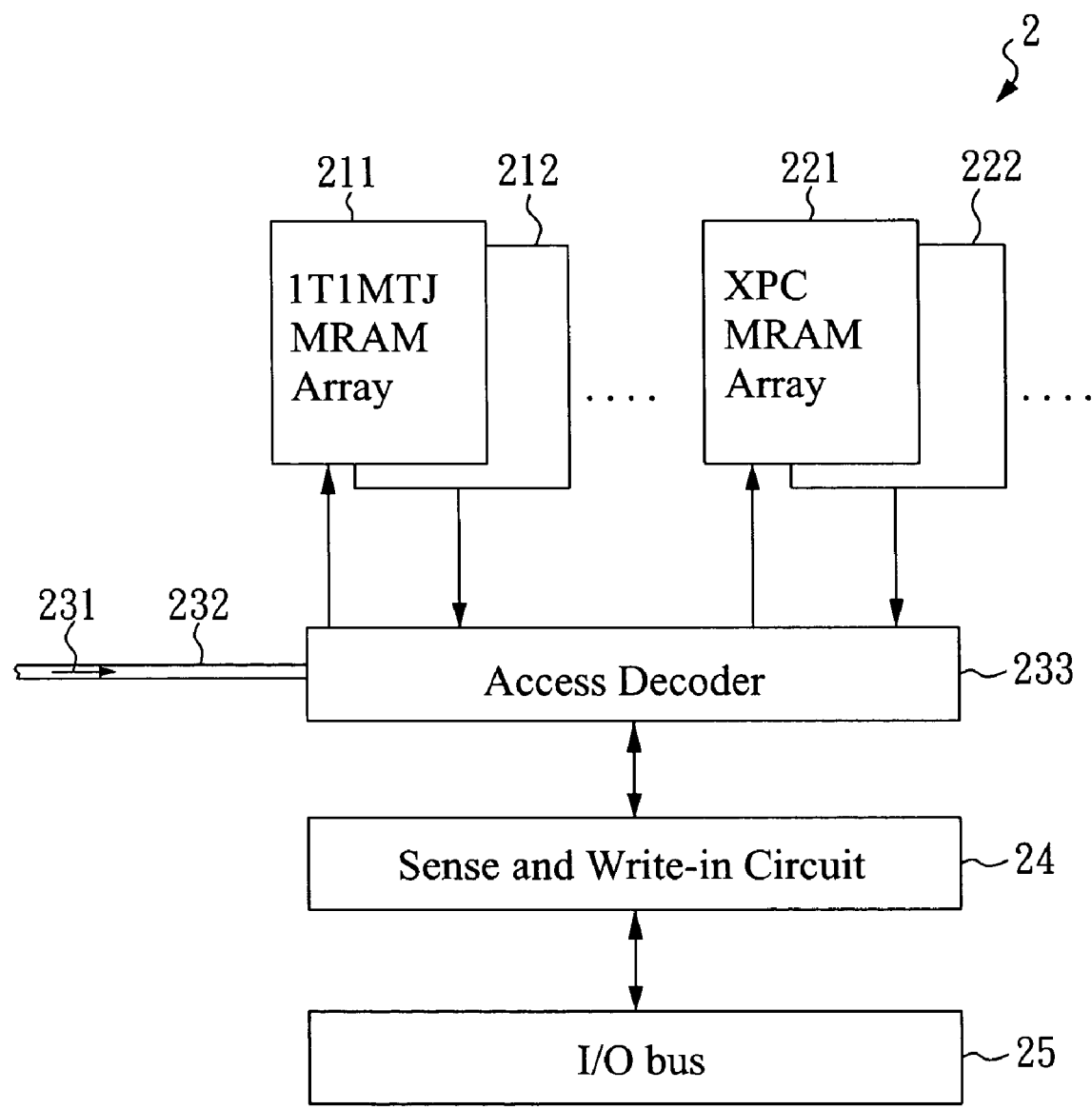
FIG. 2 is a diagram illustrating a hybrid MRAM architecture according to a preferred embodiment of the present invention.

FIG. 2 is a diagram illustrating a hybrid MRAM architecture according to a preferred embodiment of the present invention, comprising a hybrid MRAM architecture 2, an address line 232, an access decoder 233, a sensing and writing circuit 24, and an I/O bus 25. The hybrid MRAM architecture 2 comprises a plurality of MRAM arrays constituted by a plurality of 1T1MTJ architecture MRAM cells, such as two 1T1MTJ MRAM arrays 211, 212, and by a plurality of XPC architecture MRAM cells, such as two XPC MRAM arrays 221, 222. The access decoder 233 is connected to all of the aforesaid MRAM arrays 211, 212, 221, 222 and the address line 232. The sensing and writing circuit 24 is connected to both the access decoder 233 and the I/O bus 25.

When a controlling device (not shown) intends to read a specific bit of information stored in the hybrid MRAM architecture 2 according to the present invention, the controlling device (not shown) causes an address signal 231 to be transmitted to the access decoder 233 via the address line 232. Thus, the access decoder 233 causes the specific bit of information to be read out of the MRAM arrays such as either the MRAM arrays 211, 212 or the MRAM arrays 221, 222 selected in accordance with the instruction provided by the address signal 231. Then, the access decoder 233 causes the specific bit of information to be transmitted to the circuit 24 for sensing the information. The sensing and writing circuit 24 amplifies the specific bit of information and then transmits it to the controlling device (not shown) by means of the I/O bus 25 so as to complete the reading processes of the specific bit of information.

When a controlling device (not shown) intends to store (write) a specific bit of information in the hybrid MRAM architecture 2 according to the present invention, the specific bit of information is transmitted from the I/O bus 25 to the access decoder 233 via the sensing and writing circuit 24, and simultaneously, the address signal 231 is transmitted from the controlling device (not shown) to the access decoder 233 via the address line 232. At this time, the access decoder 233 causes the specific bit of information to be stored in the MRAM arrays such as either the 1T1MTJ MRAM arrays 211, 212 or the XPC MRAM arrays 221, 222 selected in accordance with the instruction provided by the address signal 231 so as to complete the writing processes of the specific bit of information.

Figure 3:
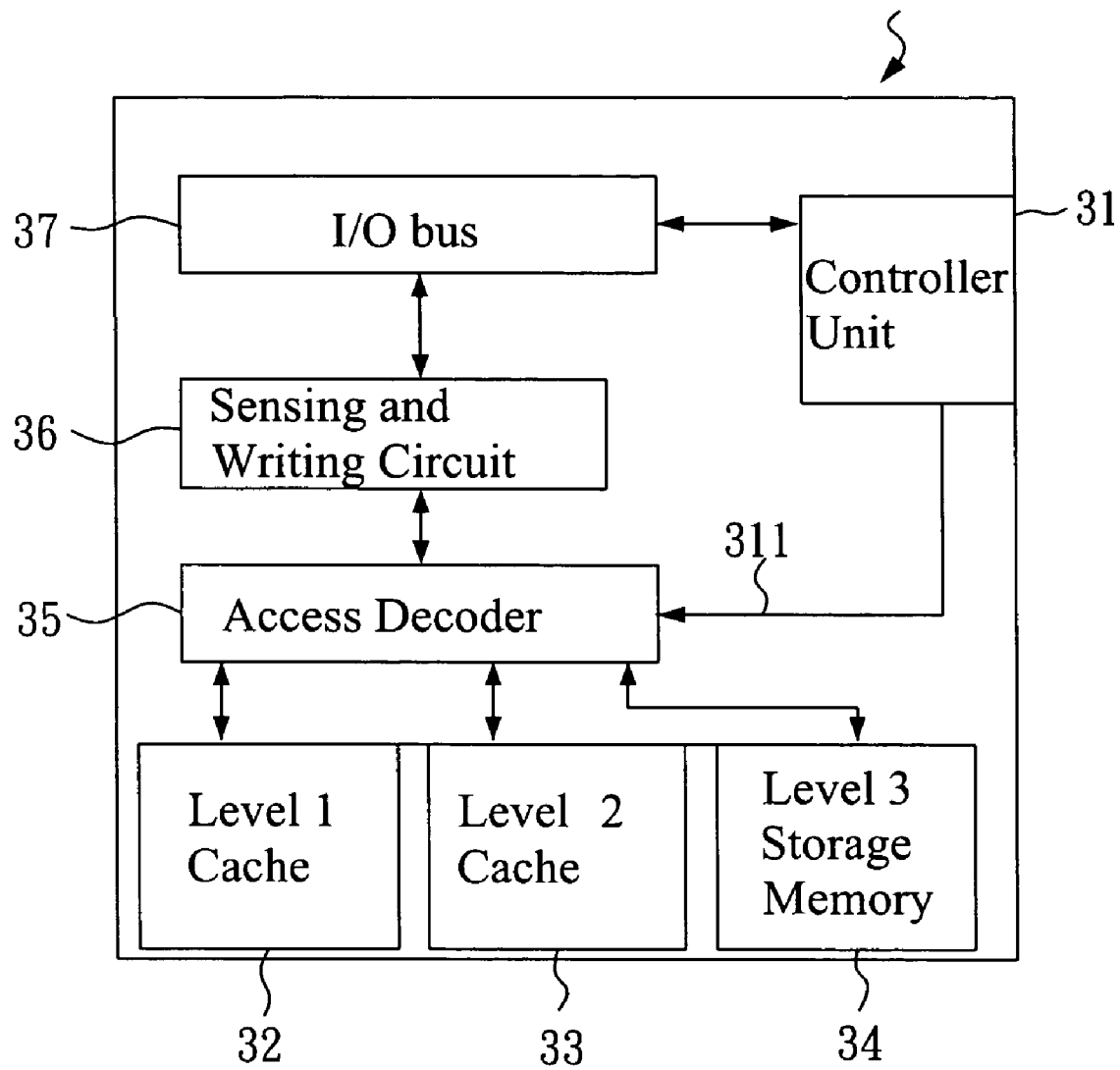
FIG. 3 is a diagram schematically illustrating a hybrid MRAM architecture according to a preferred embodiment of the present invention for being adapted to an MCU.

FIG. 3 is a diagram schematically illustrating a hybrid MRAM architecture according to a preferred embodiment of the present invention for being adapted to an MCU, in which the MCU 3 comprises a controller unit 31, a level 1 cache 32 constituted by a plurality of MRAM arrays having 1T1MTJ architecture MRAM cells respectively; a level 2 cache 33 constituted by a plurality of MRAM arrays having 1T1MTJ architecture MRAM cells respectively; a level 3 storage memory 34 constituted by a plurality of MRAM arrays having XPC architecture MRAM cells respectively; an access decoder 35 connected to the controller unit 31, the level 1 cache 32, the level 2 cache 33 and the level 3 storage memory 34; and a sensing and writing circuit 36 connected to both the access decoder 35 and an I/O bus 37 which is also connected to the controller unit 31.

When the controller unit 31 of the MCU 3 intends to read out a specific bit of information stored in the aforesaid level 1 cache 32, a level 2 cache 33 or the level 3 storage memory 34, the controller unit 31 causes an address signal 311 to be transmitted to the access decoder 35. Then, the access decoder 35 causes the specific bit of information to be read out of the memory selected in accordance with the instruction of the address signal 311, the specific bit of information being further transmitted to the sensing and writing circuit 36. The sensing and writing circuit 36 amplifies the specific bit of information and then transmits it to the controller unit 31 via the I/O bus 37 to complete the reading processes of the specific bit of information.

When the controller unit 31 of the MCU 3 intends to store (write) a specific bit of information in the aforesaid level 1 cache 32, the level 2 cache 33 or the level 3 storage memory 34, the controller unit 31 causes the specific bit of information to be transmitted to the access decoder 35 via the I/O bus 37 and the sensing and writing circuit 36, and simultaneously, the controller unit 31 causes the address signal 311 to be transmitted to the access decoder 35. At this time, the access decoder 35 causes the specific bit of information to be stored in the memory such as either the level 1 cache 32, the level 2 cache 33 or the level 3 storage memory 34 selected in accordance with the instruction of the address signal 311 so as to complete the writing processes of the specific bit information.

As described above, when the MCU 3 needs to temporarily store a specific bit of information for further reading, the MCU 3 can cause the specific bit of information to be stored in either the level 1 cache 32 or the level 2 cache 33 constituted by the MRAM arrays having 1T1MTJ architecture MRAM cells respectively. Because the 1T1MTJ architecture MRAM cell has faster access speed, the time required for accessing the specific bit of information can be shortened. Therefore, the calculating speed of the MCU 3 can be increased. On the other hand, if the MCU 3 needs to store another specific bit of information over a long period of time, the MCU 3 can cause the specific bit of information to be stored in the level 3 storage memory 34 constituted by the MRAM arrays having the XPC architecture MRAM cells respectively. Because the XPC architecture MRAM cell has higher storage density and the information storage capacity of the MCU 3 can be increased. With the use of MRAMs, the application flexibly of the MCU 3 is increased.

It is inferable from the above description that the hybrid MRAM architecture according to the present invention is capable of having two MRAMs of different characteristics (the 1T1MTJ architecture and the XPC architecture) integrated so as to use the MRAM architecture appropriate in different memory applications as needed in practice to increase the operational efficiency of the whole system. For example, the 1T1MTJ architecture MRAM having fast access speed feature serves as the cache in the memory portion where faster access is required, and the XPC architecture MRAM having high storage density feature serves as the storage memory in the memory portion where higher storage density is required. A hybrid MRAM architecture according to present invention incorporates these two different kinds of MRAMs to become an information storage means for a controller unit. Thus, the presently available memories (DRAM, SRAM and FLASH) can be replaced with the hybrid MRAM architecture according to the present invention to further improve the operational efficiency of a system in the industry.

Although the present invention has been explained in relation to its preferred embodiments, it is to be understood that many other possible modifications and variations can be made without departing from the spirit and scope of the invention as hereinafter claimed.

What is claimed is:

1. A hybrid MRAM architecture adapted to a controlling device for accessing the specific bit of information, comprising:
    a plurality of first MRAM arrays composed of a plurality of MRAM cells each of which has a 1T1MTJ architecture;
    a plurality of second MRAM arrays composed of a plurality of MRAM cells each of which has an XPC architecture;
    an address line for transmitting an address signal from said controlling device;
    an access decoder for respectively connecting to said first MRAM arrays, said second MRAM arrays and said address line, in which said specific bit of information is accessed from either said first MRAM arrays or said second MRAM arrays selected in accordance with said address signal transmitted by said address line;
    a sensing and writing circuit connected to said access decoder to amplify said specific bit of information read from said access decoder; and
    at least one I/O bus connected to said sensing and writing circuit to transmit said specific bit of information to said controlling device.

2. The hybrid MRAM architecture according to claim 1, wherein said controlling device is a central processing unit.

3. The hybrid MRAM architecture according to claim 1, wherein said first MRAM array is a level 1 cache.

4. The hybrid MRAM architecture according to claim 1, wherein said first MRAM array is a level 2 cache.

5. The hybrid MRAM architecture according to claim 1, wherein said second MRAM array is a level 3 storage memory.

6. The hybrid MRAM architecture according to claim 1, wherein said first MRAM array is a code type memory.

7. The hybrid MRAM architecture according to claim 1, wherein said second MRAM array is a code type memory.

* * * * *